Figure 4:
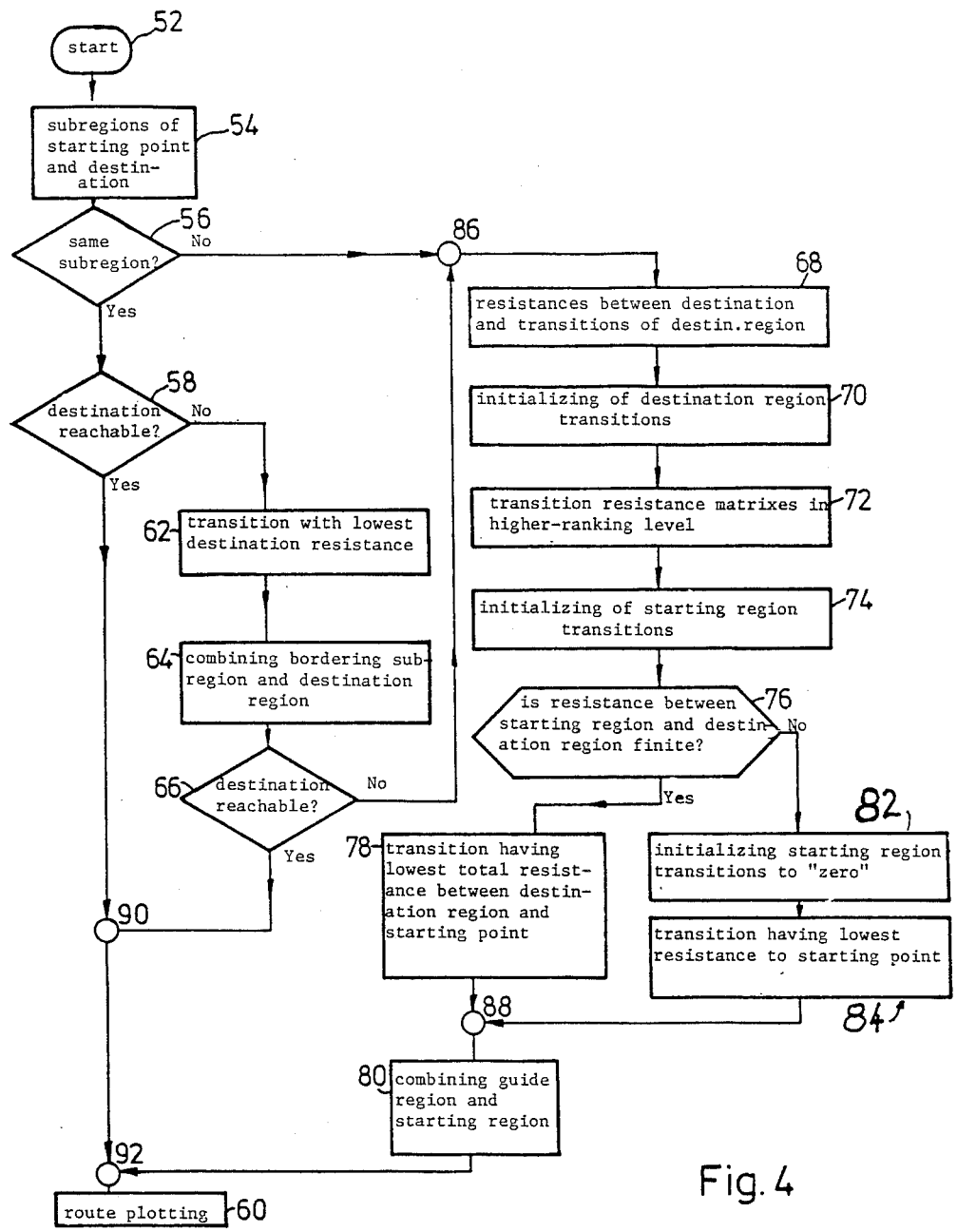

United States Patent [19]
Neukrichner et al.

[11] Patent Number: 4,984,168
[45] Date of Patent: Jan. 8, 1991

[54] METHOD AND APPARATUS FOR DETERMINING A ROUTE BETWEEN A STARTING POINT AND A DESTINATION

[75] Inventors: Ernst-Peter Neukrichner, Hildesheim; Dietmar Schlögl, Sibbesse, both of Fed. Rep. of Germany

[73] Assignee: Robert Bosch GmbH, Stuttgart, Fed. Rep. of Germany

[21] Appl. No.: 307,088

[22] PCT Filed: Jun. 4, 1988

[86] PCT No.: PCT/DE88/00329
§ 371 Date: Aug. 24, 1989
§ 102(e) Date: Aug. 24, 1989

[87] PCT Pub. No.: WO88/09974
PCT Pub. Date: Dec. 15, 1988

[30] Foreign Application Priority Data
Jun. 6, 1987 [DE] Fed. Rep. of Germany ....... 3719017

[51] Int. Cl.[5] .............................................. G06F 15/50
[52] U.S. Cl. ..................................... 364/449; 340/995
[58] Field of Search ................ 364/449, 443; 340/990, 340/995

[56] References Cited
U.S. PATENT DOCUMENTS

| | | | |
|---|---|---|---|
| 4,570,227 | 2/1986 | Tachi et al. | 364/444 |
| 4,675,676 | 6/1987 | Takanake et al. | 340/995 |
| 4,760,531 | 7/1988 | Yasui et al. | 364/443 |
| 4,812,980 | 3/1989 | Yamada et al. | 364/449 |

FOREIGN PATENT DOCUMENTS
2139794  11/1984  United Kingdom .

OTHER PUBLICATIONS
Bosch Technische Berichte, vol. 8, No. 1, 1986, pp. 7–14.
AFIPS Conf. Proc. National Computer Conference, 9–12; Jul. 1984, p. 6960706.
Funkschau, Issue 4, Feb. 1985, (Munich, Fed. Rep. Germany), pp. 33–36.

*Primary Examiner*—Thomas G. Black
*Attorney, Agent, or Firm*—Frishauf, Holtz, Goodman and Woodward

[57] ABSTRACT

In a method for determining a route between a starting point and a destination which are located on a digitally memorized road map, the problem is to perform the necessary calculations for determining the route within a short time, even for extensive road systems. Otherwise, the results could arrive too late and could no longer lend the driver any aid in making a decision. The object is attained by dividing the road map into at least two levels of different grid density and regional size and storing it in memory. A plurality of smaller subregions of fine grid density are assigned to the lower level, and one or more larger subregions of coarser grid density are assigned to the higher level. Beginning with the lower level of the road map, a possible route is then studied; if the results are negative, a transition is made to the next-higher level, until a positive result is attained. Then the route is plotted within whatever level a positive result was attained in, for instance in the same level or back and forth between the levels.

15 Claims, 6 Drawing Sheets

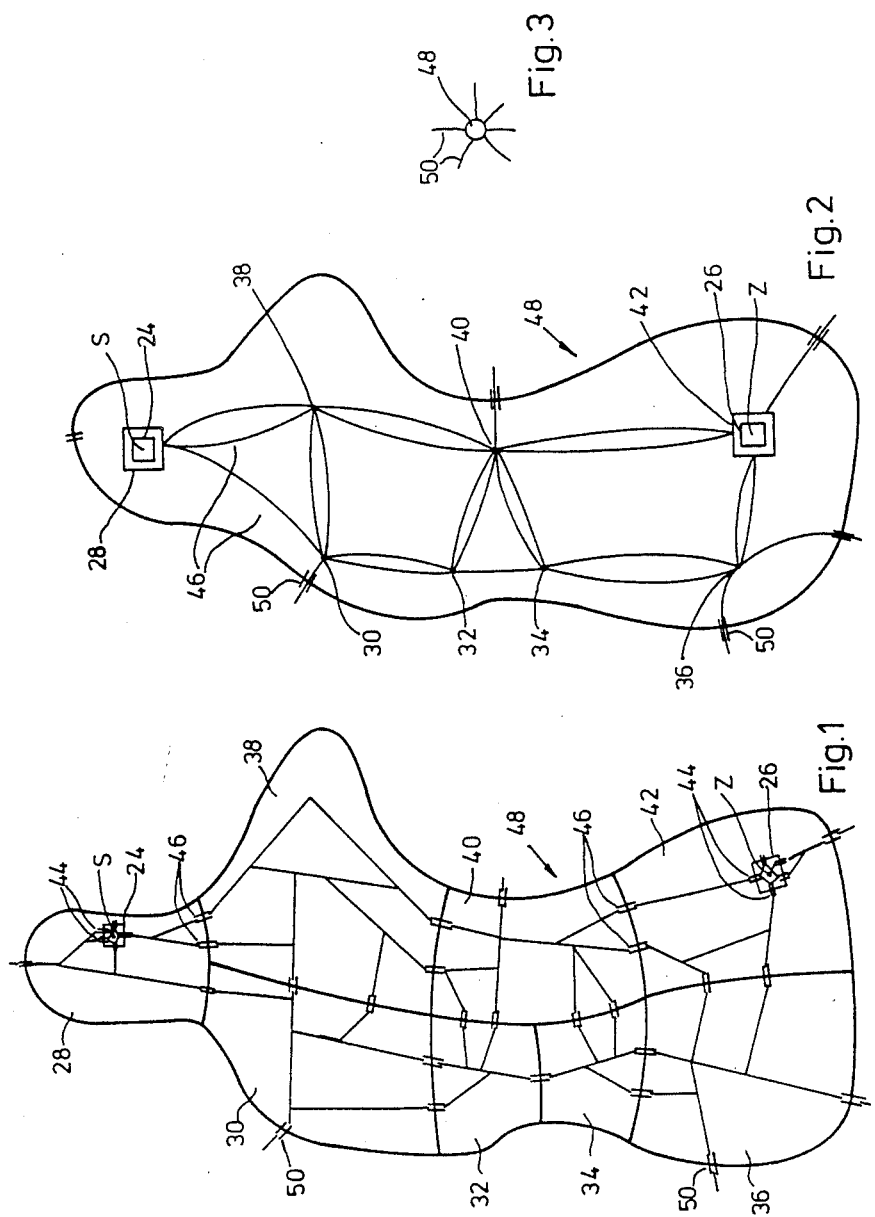

Predecessors
a: b,c,j b: a,h,p
c: d,e,l
j: i,k,m,o h: f,g,n
p: i,k,m,o
d: b,c,j
e: f,g,n
l: i,k,m,o
i: b,c,j
k: d,e,l
m: f,g,n
o: a,h,p f: d,e,l
g: a,h,p
n: i,k,m,o

| Edge | Destination Resistance | Optimal Successor |
|---|---|---|
| a | 0 | - |
| b | 1 | a |
| c | 1 | a |
| d | 2 | c |
| e | 2 | c |
| f | 3 | h |
| g | 3 | h |
| h | 2 | b |
| i | 2 | j |
| j | 1 | a |
| k | 2 | j |
| l | 2 | c |
| m | 2 | j |
| n | 3 | h |
| o | 2 | j |
| p | 2 | b |

METHOD AND APPARATUS FOR DETERMINING A ROUTE BETWEEN A STARTING POINT AND A DESTINATION

FIELD OF THE INVENTION

The invention relates to a method and a system for determining a route between a starting point and a destination.

BACKGROUND

An autonomous direction-finding and navigation system known as EVA (electronic navigator for drivers) for land vehicles is in development. Calculation of an optimal route from an arbitrary starting point to a freely selectable destination or target is based on a road map stored digitally in memory. The greater the distance between the destination and the starting point, the more manifold the possible ways of reaching it by using the memorized road map. These routes are not all equally good; the optimal route must therefore be ascertained by calculation. The computing time needed for extensive computations may mean that the results are not available to the driver in time; he may already have missed a fork in the road or an intersection where he should have turned.

THE INVENTION

It an object of the invention to devise a method and a system for determining a route between a starting point and a destination that ascertains the optimal route quickly and reliably, even for extensive road systems.

Briefly, a computer is coupled to a read-only memory which, in accordance with a feature of the invention, is subdivided to store the maps of regions in at least two levels in which one of the levels contains a plurality of smaller subregions, and the resolution of the maps is to be such that the grid density is fine; and the resolution of other levels become coarser and coarser. The route is then plotted by determining first if the starting point and the destination or target are on the same lowest level map; if so, the route can be plotted directly based on the memory within this lowest level subregion. For a longer trip, the starting point and destination will not be on the same sublevel. The computer then transfers into the computer working memory only those maps from the next higher level memory which have transitions to the fine, lower level maps in which the starting point and destination are located. Thus, only selected portions of coarser-and-coarser road maps need be transferred into the operating memory of the computer, thus substantially decreasing computation time.

The invention is based on the consideration that in the vicinity of the starting point and destination, traffic is carried over secondary roads, while the longer distances are covered over highways and superhighways. Highways and superhighways carry the combined streams of traffic from various regions. In a relatively large region, if only the roads carrying long-distance traffic are taken into account, the resultant road map has a coarser grid density, so there are fewer options for variation over different roads and less computation time for the on-board computer is therefore required.

Dividing the road map into levels is suitably done in such a way that each region offset approximately the same number of options for variation in finding the route segment to take, and thus occupies the same number of memory locations in the computer and correspondingly requires the same computing time. Geographical characteristics can also be considered, and particularly if a plurality of different transitions or connections exist between the several regions. In joining several regions of a lower or lower-ranking level into a high-level region, once again these criteria are employed. In this way, several levels can be formed with make it possible to work out a route even over international borders.

It is particularly suitable if the grids are formed from roads and hubs, with the hubs in the lower level representing forks or intersections and those in the higher level representing subregions of the lower or next-lower level. In this way, the same systematics can be continued at the transition from one level to another, and the route determination can be performed by the same algorithm. Electrical resistance values are suitably, assigned to the roads and hubs; they are for instance set low for superhighways, because of the relatively short distance and travel time from point to point, and are set high for secondary roads that have many curves and go through tows, because of the relatively long distances and travel time from point to point. In selecting the route, roads that have the lowest resistance are therefore preferentially selected.

In determining an optimal route, various criteria must be taken into account, so that favorable results are obtained for all possible relationships of starting point and destination. For instance, when the starting point and destination are in the same part of a region, it is suitable for a route to be determined within this subregion. If that is not possible, then an attempt is made to reach the destination via a neighboring subregion. These operations are performed while still in the same level.

If the starting point and destination are far apart, then the major transitions between these subregions are ascertained; transition resistance matrixes are formed in the higher level, and in the lower level these matrixes are linked to the resistances between the starting point and the transitions of the starting region. For optimization, a neighboring subregion is then also used as a guide region, to enable a shorter route to the superhighways, via any secondary roads that may be available.

The invention also relates to an apparatus or system for determining a route between a starting point and a destination.

In this connection, the object is to devise an apparatus or system which enables fast, reliable route determination even for relatively large road systems.

By storing the various levels at different sites in a read-only memory, the data at the transition from one level to another can be transferred directly to the working memory, where they can be used for calculation. This means that the data in the various levels of the road map need not be separately calculated from a common data set.

Further features and advantageous embodiments of the invention will become apparent from the other claims and the description and from the drawing, which shows an exemplary embodiment of the subject of the invention.

DRAWINGS, WHICH SHOW

Figure 5:
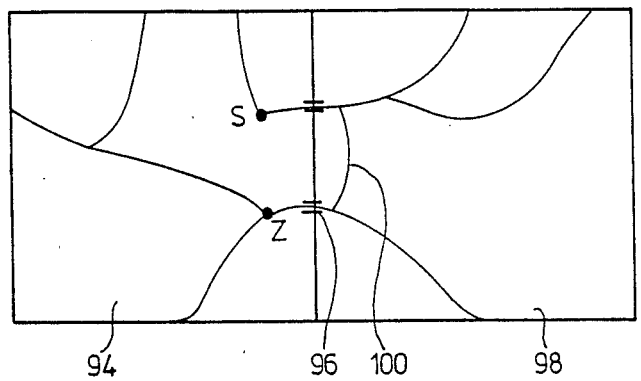
Figure 6:
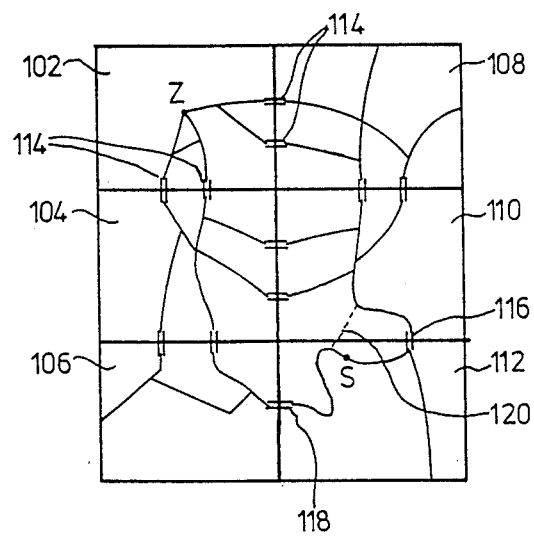
Figure 7:
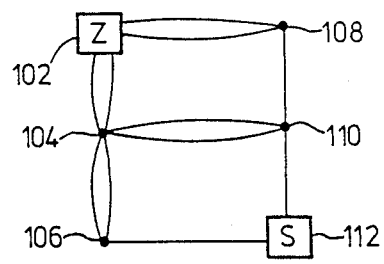
Figures 8, 9:
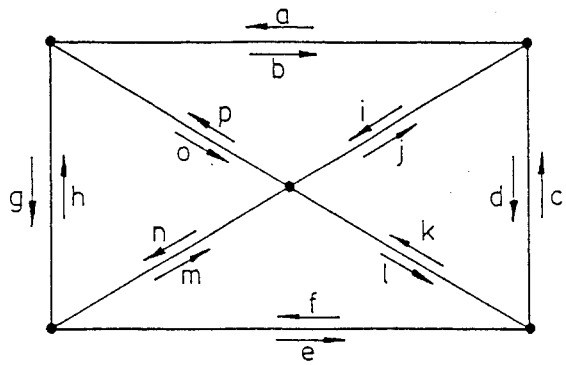
Figure 10:
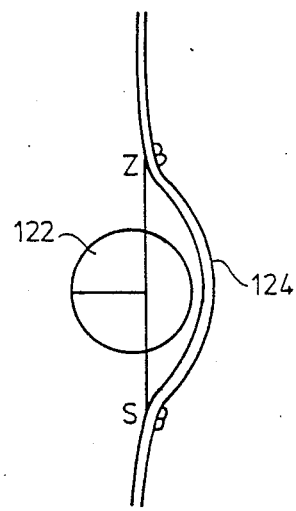
Figure 11:
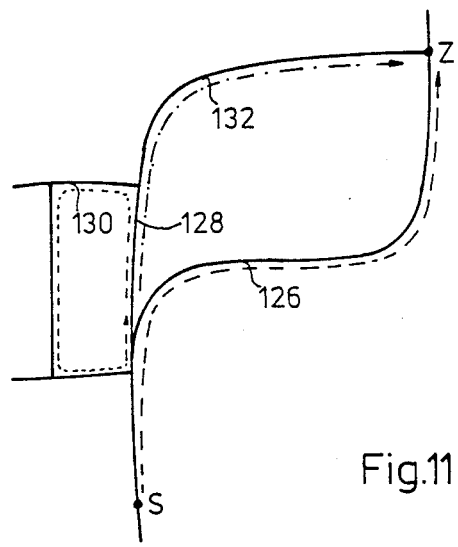
Figure 12:
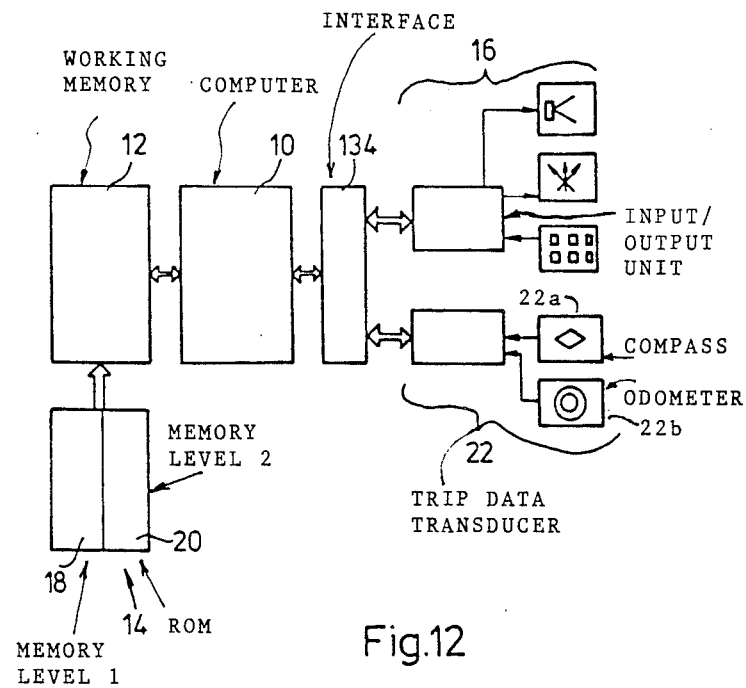

Shown in the drawing are:

FIG. 1, a road map of a relatively large region on the lower level and on a next-higher level, FIG. 2, a road map of the same region on a still-higher level, FIG. 3, the region from another higher level, FIG. 4, a flow chart to illustrate a preferred sequence of the method, FIG. 5, a detailed from a road map, in which a destination cannot be reached directly from the starting point, FIG. 6, a road map of a region for illustrating the sequence of the method, FIG. 7, a road map of the same region on a next-higher level, FIG. 8, a representation of the Ford-Moore algorithm, FIG. 9, a table to illustrate the Ford-Moore algorithm, FIG. 10, a detail from a road map showing a city region and a superhighway region, FIG. 11, an illustration of a route correction, and FIG. 12, a block circuit diagram of an apparatus according to the invention.

In FIG. 1, the road map of a relatively large region, such as the Federal Republic of Germany, is shown. The road map is divided into subregions, two of which subregions 24 and 26 are shown in the lower level. No other subregions have been shown in the lower level, for the sake of simplicity. Larger subregions 28 . . . 42 having a coarser grid are shown in the next-higher level. Each of these sub regions, in turn, includes a plurality of smaller subregions, not shown, of the lower level.

Transitions are indicated at the common borders between two subregions. In the lower level, these are transitions 44, and in the next-higher level transitions 46. The selection of the subregions is made in accordance with the local grid density of the actual traffic system, taking existing connecting roads into account. In cities, the area of a subregion will be quite small, while in a thinly-populated region in the country it will be quite large.

FIG. 2 shows the road map of the same region as in FIG. 1, on another higher level. From the subregions 28 . . . 42, still shown n spatially extended form in FIG. 1, hubs have now been formed. The connections between hubs are shown as connecting roads 46, which correspond to the transitions 46 in FIG. 1. By comparing the two views, the systematics by which the road map is divided into subregions on different levels is done can already be seen. For further comprehension, see FIG. 3, in which the entire region 48 of FIG. 1 and FIG. 2 at the transition to another higher level has been converted into a hub, with only transitions 50 to neighboring countries leading away from it.

In the road map, resistance values are assigned to the various roads and intersections, or connections and hubs. These resistors for instance define the route length, the required travel time, or the average traffic density. If the resistance of the respective resistors is low, the applicable road or fork or hub or connection is used preferentially for route determination. If the resistance of the resistors is high, it is not taken into account unless other routes are even less favorable.

Since the method according to the invention is intended to provide optimal results regardless of the relationship between the starting point and destination, several distinctions must be made among specific cases. These relate essentially to the question whether a connection must be determined in the same level or in a higher level. A flow chart of a preferred embodiment that takes these criteria into account is provided in FIG. 4.

Beginning at the start 52 of the method, the subregions in which the starting point and destination are located are first determined in block 54. Next, in block 56, it is decided whether they are located in the same subregion. If so, then the situation involves a simple case. Then, a decision is made in block 58 whether the destination can be reached from the starting point within the same subregion, or not. If the decision is "YES", then the simplest case is involved, and the route can be plotted directly.

The procedure is different if the destination cannot be reached from the starting point within the same subregion. In that case, in block 62, the transition having the lowest resistance from the destination is determined. Next, in block 64, the subregion that borders on this transition and the subregion in which the starting point and destination are located are joined together. In block 66, the decision is made whether the destination can now be reached from the starting point. If so, then in block 60 the route is plotted. The "YES" decisions from blocks 58 and 66 are joined together in the addition block 90.

The above-described special case is illustrated in FIG. 5. Here there is no direct connection between the starting point S and the destination Z in the subregion 94. The transition having the lowest resistance from the destination Z is now determined; it is transition 96. The subregion 98 bordering on this transition 96 is now combined with the subregion 94. In the next decision, as to whether a possible connection exists, the question is now answered affirmatively, because of the road 100, and the route is plotted.

However, if a connection is still not possible, then again referring to FIG. 4, the method sequence continues via the addition block 86 together with the negative decision in block 56, according to which the starting point and the destination are located in different subregions. In that case, the resistances from the destination to the transitions of the destination region are determined in block 68. In block 70, the transitions are then initialized or set, or identified, or called up with the destination resistances.

Now, the transition is made to the next-higher level. In block 72, the transition resistance matrixes are determined in the road map of the next-higher level. Next, in block 74, the transitions of the starting region are initialized with the resistances of the destination.

Now a transition back to the lower level is made. In bock 76 it is decided whether the resistance between the starting point and the destination region is finite. If so, then in block 78 the transition that has the lowest total resistance between the destination region and the starting point is determined. After that, in block 80, the subregion that borders on this transition (guide region) is combined with the starting region, and in block 80 the route is plotted. In this case the addition block 92 is used to join the various paths of the method.

The above-described method sequence is illustrated in FIGS. 6 and 7. Once again a detail from a road map is shown, having subregions 102-112. The resistances at the transitions 114 are first determined, and then initialized with the resistances at the destination. Then, using the road map as shown in FIG. 7, the determination of the transition resistance maxtrixes is made. Next, the transitions 116 of the starting region are initialized with the resistances of the destination region.

The resistance between the starting point and the destination region is finite, in the present case. When the transition having the lowest total resistance is determined, the result is the transition 116. The subregion 110 bordering this transition becomes the guide region L. Since these two subregions 110 and 112 are not combined, the route determination can also take into account secondary roads, which were not taken into account at the major transitions 116 and 118 in the next-higher level. Therefore, as FIG. 6 shows, the road 120 shown in dashed lines is also taken into account in the route determination.

Again referring to FIG. 4, if the resistance between the starting point and the destination region is not finite, then a branch, or detour is made from block 76 to block 82. In block 82, the transitions of the starting region are initialized with zero. After that, in block 84, the determination of the transition having the least resistance from the starting point is made. Next, by linking the decision sequence path through the addition block 88 to the step sequence defined in block 80, the process is continued, so that as the complete method is performed; all possible variations are thus explained.

FIG. 8 shows a network for explaining an algorithm that can be used to calculate the road map, namely the inverse Ford-Moore algorithm. Intermediate results of the use of the algorithm are shown in FIG. 9. For reference to the Ford-Moore algorithm, see ACM transactions on Math. Software 6, 1989, issue 3, U. Pagel, Algorithm 562 shortest path length; and Jürgen Ebert, "Effiziente Graphenalgorithmen" ("Efficient Graph Algorithmns"), Akademische Verlagesgesellschaft Wiesbaden, 1981, pp. 191, 194, 195, ISBN 3-400-00424-3.

The next work shown in the drawing is a description of the map, with information on how the map edges intersect with the hubs and on how long the linked paths are, such as the time required to traverse the various edges (trip segment resistance) and to traverse the hub regions from the end of each edge entering a hub to the beginning of each edge departing from it (resistance to making a turn).

For both directions, each edge of the map is assigned an added-up or summed time duration or requirement to destination (destination resistance) and an optimal successor (number of the next edge leading to the destination). Two standbys lists for the edge numbers to be processed in the next method step are made.

In the starting step, the destination resistances of all the edges of the map are occupied by the largest available resistance. The destination resistance of the destination edge is occupies by zero. The number of the destination edge is put on a first list.

In the first step, the destination resistances of all the predecessors of all the edges included in the first list are compared with the resistances that result as a sum of the destination resistance of the various edges included in the first list and the associated turning and trip segment resistances. If this sum is smaller, then it is listed as a new destination resistance of the applicable predecessor, and the number of that predecessor is stored in memory in a second list.

In a second step, a check is made whether the second list is empty. If so, the route search is concluded; otherwise, all the edge numbers included in the second list are transferred to the first list, and the method is continued with the first step.

The method described works even if it is initialized with more than on destination edge. In that case, it always leads to the destination that can be reached fastest. If a destination resistance of a destination is not initialized with zero but rather with an arbitrary finite resistance, then that destination is either favored or discounted over another one, in accordance with the initial resistances used.

FIG. 10, to illustrate the defining of resistances, shows a detail of a road map with a city region 122 and a superhighway region 124. From the starting point S to the destination Z, streets of the city region 122 and roads of the superhighway region 124 can both be selected. When the road map is memorized, the streets and roads are initialized with suitable resistances. The streets of the city region 122 are assigned a high resistance, and the roads of the superhighway region 124 are assigned a low resistance. These resistances are then taken into account in the selection of the route.

FIG. 11 illustrates a route correction. Suitably, the actual position of the vehicle is ascertained continuously by trip data transducers, and the driver is given instructions via a display or speaker device. It is assumed that along the way from the starting point S to the destination Z, the recommendation is made to take road 126. If the driver continues along road 128, an alarm is sounded, and a decision is called for as to whether a "driving error" has been made or an "intentional change in route". If the first case is confirmed, then an unchanged map is used to calculate the route. In the second case, the resistance of the road 126 is raised considerably, so that it will no longer be taken into account in the selection of the route.

In cases were actuation of the input unit does not occur, the resistance of the route segment recommended but not taken in automatically increased in increments, and the route is recalculated. This assures that in the event of wrong turns, the option to return to the point of the wrong turn remains, but if the recommendation is repeatedly ignored, this option becomes more and more unlikely and finally disappears.

FIG. 12, finally, shows a block circuit diagram of an apparatus according to the invention. It includes a computer 10 with a working memory 12 and a read-only memory 14 having two memory regions 18 and 20, for instance in the form of a CD-ROM. Via an interface 134, the computer 10 is connected to an input/output unit 16 and a trip data transducer 22, such as an odometer 22b or a tachometer, a direction transducer or compass 22a, and the like, as well known.

The identifications for the starting point and destination in the road map are fed into the computer 10 via the input/output unit 16. From the read-only memory 14, the elements in the description of the memorized road map necessary for calculating the start/destination relation are then copies into the working memory 12 from ROM 14. The computer 10 is now in a position to perform the method of route determination described above. Once the calculation has been performed, a number of identifications for roads to be traveled next, beginning at the actual position, in order to follow the route calculated, are fed in via the input/output unit 16.

Via the input/output unit 16, the method can also be varied in such a way that if recent changes in the road system are not yet included in the road map, a return to that point is not made. This is attainable by substantially increasing the resistance assigned to a road segment that is not open to traffic, and the route determination is then re-calculated.

To store the description of the road map in memory, the ROM 14 is divided into two memory regions 18 and 20. Because of these two memory regions, a route determination in both levels, and a transition from one level to another, can both be made without calculating the data from a single common map description. The map description for the entire map, divided into subregions, includes the following:

the description of all the road segments of the map;
the relationship of the road segments to one another; and
the average time required to travel over the road segments, and the connections with one another.

The map description for all the subregions of the map also includes, per subregion:

a list of the major traffic-carrying transitions leading into adjacent subregions,
a matrix of map resistances for connecting the major transitions of a subregion with one another.

We claim:

1. A method for determining a route between a starting point (S) and a destination or target (Z), which are located on a road map, and digitally stored in a read-only memory (14).

comprising the steps of
dividing the road map into at least two levels of different grid density and regional size;
storing the maps of said at least two levels in at least two levels (18, 20) of said memory;
assigning a plurality of smaller subregions of fine grid density to a lower one of said levels and assigning one or more larger subregions of coarser grid density to a higher one of said levels;
first analyzing the road maps with the lowest level to find a possible route between the starting point (S) and the destination (Z), and
if the results of such analysis are positive, plotting the route based on the memory within said level; or
if the results of said analysis are negative, so that no connecting route between the starting point (S) and the destination (Z) is found,
analyzing the road map stored in the memory of the next higher level;
determining when a positive result is obtained; and
then plotting the route based on the contents of the memories in said at least two levels.

2. The method of claim 1, wherein all roads open to traffic are included within the lower level, and only roads connecting the subregions of the lower or next-lower level are included within the higher level.

3. The method of claim 1, wherein the grids are formed from roads and hubs, the hubs in the lower level representing forks or intersections in the roads and the hubs in the higher levels representing subregions of the lower or next-lower level.

4. The method of claim 1, wherein the roads and hubs are assigned resistance values as a function of at least one of:
the trip segment;
means travel time;
traffic density, and
the step of analyzing the road maps includes the step of selecting the roads and hubs having the lowest total resistance values.

5. The method of claim 4, including the step of determining the subregion or subregions of the starting point and of the destination, and
if the starting point and the destination are located in the same subregion, determining if the destination can be reached from the starting point, and
if the starting point and the destination are located in different subregions,
determining the resistance form the destination to the transitions of the region including the destination and within the destination region to derive a destination resistance;
setting or initializing transitions between the different subregions and identifying or initializing the destination resistances;
forming, for the road map in the higher level, transition resistance matrices;
setting or initializing the transitions of the region which includes the starting point, and forming the starting region, with the resistances of the destination region; and
determining whether the resistances between the starting point and the destination are a finite value.

6. The method of claim 5, wherein said step of plotting the route includes
determining if the destination can be reached from the starting point within the same subregion and
if it can be reached within the same subregion, displaying the route on a display unit; and
if it cannot be reached within the same subregion,
determining the transition having the lowest resistance from the destination to determine a destination resistance;
combining the subregion which boarders this transition and the original destination region;
determining whether the destination can then be reached from the starting point; and
if so, plotting the route and displaying the so-plotted route;
if not, continuing determination of resistances from the destination to the transitions of the destination region.

7. The method of claim 5, wherein said step of determination whether the resistance between the starting point and the destination region is finite includes
determining the transition of the starting region having the lowest total transition resistance between the destination region and the starting point;
combining the subregion which boarders said transition of lowest transition resistance, and forming a guide region, with the starting region;
plotting the route; and
if the resistance between the starting point and the destination region is not finite,
setting or initializing the transitions of the starting region with zero;
determining the transition which offers the lowest resistance from the starting point; and
combining the subregion which boarders said transition with the starting region.

8. The method of claim 1, wherein the route is determined from the destination point backward to the starting point.

9. The method of claim 8, wherein the route is determined by the inverse Ford-Moore algorithm.

10. The method of claim 1, including the step of displaying the route as plotted.

11. The method of claim 1, including the step of comparing the route with data representing vehicle distance traveled and direction;

determining if forks or intersections are present in the road of the route as plotted;

and indicating recommended travel direction in visual or auditory form.

12. The method of claim 1, including the step of determining if the vehicle follows the recommended route;

and, if not, activating at least one of:

an alarm to indicate whether a "driving error" is present;

an inquiry if an "intentional change in route" is desired by the user.

13. The method of claim 12, including the step of calculating the route using the map as originally plotted if the user acknowledge a "driving error"; and recalculating the route by assigning an infinite resistance to the road on the map along the route which comes next after the last road taken along the calculated route if the user signals that an "intentional change in route" was made.

14. A navigation system to determine a route between a starting point (S) and a destination or target point (Z), which are located on a road map, comprising a computer (10);

a working memory (12) for said computer;

a display and input/output unit (16) coupled to said computer;

a read-only memory (14) digitally storing a road map on which said starting points (S) and said destination or target (Z) are stored, wherein said read-only memory (14) comprises at least two read-only memory levels (18, 20), in which one of said memory levels or regions includes the road maps of a plurality of small subregions with fine grid density, and another one of said levels includes the road maps of large subregions of coarser grid density;

and wherein said computer reads from said lower level read-only memory into the working memory (12) only those portions of the memory contents representing the respective smaller subregions of finer grid density including the starting point (S) and the destination or target (Z) and, if the starting point and destination and target are not on the same subregions, also those data from the higher level memory including the road maps of larger subregions of coarser grid density and having transitions to the subregions of the lower level and of the finer grid density.

15. The system of claim 14, further including a trip data transducer (22) coupled to the computer (10) to introduce into the computer data representative of the trip between the starting point (S) and the destination (Z) representative of distance and direction.

* * * * *